United States Patent
Sunaga et al.

(10) Patent No.: US 6,370,026 B2
(45) Date of Patent: Apr. 9, 2002

(54) MOUNTING STRUCTURE FOR MOUNTING POWER ELEMENTS TO HEAT DISSIPATION MEMBER

(75) Inventors: Hideki Sunaga, Gunma; Shigenori Ohira, Ibaraki; Narihito Sano, Tochigi; Kazunori Yamada, Tochigi; Takeshi Oba, Tochigi, all of (JP)

(73) Assignee: Calsonic Kansei Corporation, Tokyo (JP)

( * ) Notice: Subject to any disclaimer, the term of this patent is extended or adjusted under 35 U.S.C. 154(b) by 0 days.

(21) Appl. No.: 09/754,198

(22) Filed: Jan. 5, 2001

(30) Foreign Application Priority Data

Mar. 2, 2000 (JP) .......................................... 2000-057287

(51) Int. Cl.[7] .................................................. H05K 7/20
(52) U.S. Cl. ........................... 361/719; 257/719; 361/704
(58) Field of Search ........................... 174/16.3; 165/80.3, 165/185; 267/150, 158, 160; 24/453, 457, 458, 625; 257/706, 707, 722–724, 726, 727, 718, 719; 361/703, 704, 707, 709–712, 717–719

(56) References Cited

U.S. PATENT DOCUMENTS

| | | | | |
|---|---|---|---|---|
| 4,575,038 A | * | 3/1986 | Moore | 248/505 |
| 5,130,888 A | * | 7/1992 | Moore | 361/717 |
| 6,081,424 A | * | 6/2000 | Mach et al. | 361/704 |
| 6,229,706 B1 | * | 5/2001 | Cook et al. | 361/719 |
| 6,243,264 B1 | * | 6/2001 | Bollesen et al. | 361/704 |
| 6,249,436 B1 | * | 6/2001 | Bollesen | 361/720 |
| 6,304,449 B1 | * | 10/2001 | Zhang | 361/704 |

* cited by examiner

Primary Examiner—Gerald Tolin
(74) Attorney, Agent, or Firm—Foley & Lardner

(57) ABSTRACT

A power element mounting structure for use in a brushless motor comprises a circuit board; a spring plate of metal, the spring plate being resiliently mounted, through a first mounting structure, on the circuit board keeping a given space therebetween; a plurality of power elements disposed on the spring plate to form a semi-assembled unit; a heat dissipation member of metal having a plurality of heat dissipation fins on an outer surface thereof, the heat dissipation member being mounted, through a second mounting structure, on the semi-assembled unit in such a manner that an inner surface thereof faces toward the power elements; and a plurality of spring pieces defined by the spring plate, the spring pieces being arranged to press the power elements against the inner surface of the heat dissipation member.

13 Claims, 11 Drawing Sheets

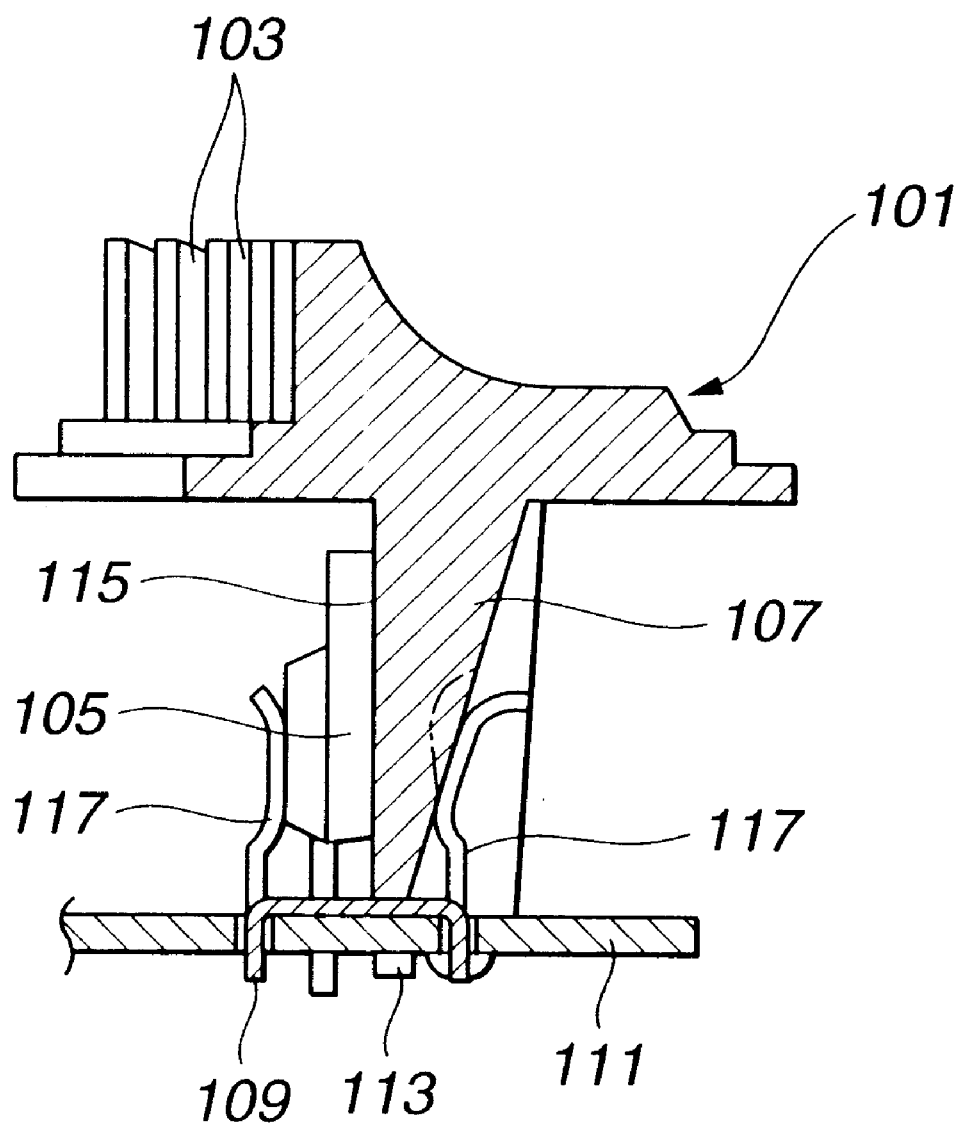

MOUNTING STRUCTURE FOR MOUNTING POWER ELEMENTS TO HEAT DISSIPATION MEMBER

BACKGROUND OF THE INVENTION

1. Field of the Invention

The present invention relates to mounting structures for mounting power elements to a heat dissipation member, and more particularly to the mounting structures of a type that is suitable for a brushless motor.

2. Description of the Prior Art

As is known, a power element is a control element that controls voltage and/or current and generates a certain heat under operation. For effectively removing such heat, various mounting structures have been proposed and put into practical use. One of them is disclosed in Laid-open Japanese Patent Application 2000-32729, whose essential portion is shown in FIG. 20 of the accompanying drawings. In this mounting structure, heat generated from the power element is transferred to a heat dissipation member through a heat sink. In the drawing, denoted by numeral 105 is a power element. The power element 105 contacts to a leg portion 107 of a heat sink 101. The heat sink 101 is formed with a plurality of heat dissipation fins 103 which serve as the heat dissipation member. Terminals 109 of the power element 105 are soldered to a circuit on a circuit board 111. The leg portion 107 of the heat sink 101 is connected to the circuit board 111 by means of a bolt 113. As shown, the power element 105 is pressed against a surface 115 of the leg portion 107 by means of a spring member 117. Thus, under operation, heat generated from the power element 105 is transferred to the heat dissipation fins 103 through the leg portion 107.

However, in this conventional power element mounting structure, provision of the leg portion 107 causes increase in length of a so-called heat travelling path and thus makes the heat dissipation effect poor. Furthermore, in this mounting structure, the leg portion 107 needs a certain strength and thus a larger size because it has to hold the power element 105 and has to serve as a good heat transferring means. Of course, in this case, the power element mounting structure becomes bulky, heavy and costly.

SUMMARY OF THE INVENTION

It is therefore an object of the present invention to provide a structure for mounting power elements to a heat dissipation member, which is free of the above-mentioned drawbacks.

According to the present invention, there is provided a structure which comprises a circuit board; a spring plate of metal, the spring plate being resiliently mounted, through a first mounting structure, on the circuit board keeping a given space therebetween; a plurality of power elements disposed on the spring plate to form a semi-assembled unit; a heat dissipation member of metal having a plurality of heat dissipation fins on an outer surface thereof, the heat dissipation member being mounted, through a second mounting structure, on the semi-assembled unit in such a manner that an inner surface thereof faces toward the power elements; and a plurality of spring pieces defined by the spring plate, the spring pieces being arranged to press the power elements against the inner surface of the heat dissipation member.

BRIEF DESCRIPTION OF THE DRAWINGS

Other objects and advantages of the present invention will become apparent from the following description when taken in conjunction with the accompanying drawings, in which:

FIG. 20 is an enlarged sectional view of a part of a conventional power element mounting structure.

DETAILED DESCRIPTION OF THE EMBODIMENTS

Figure 1:
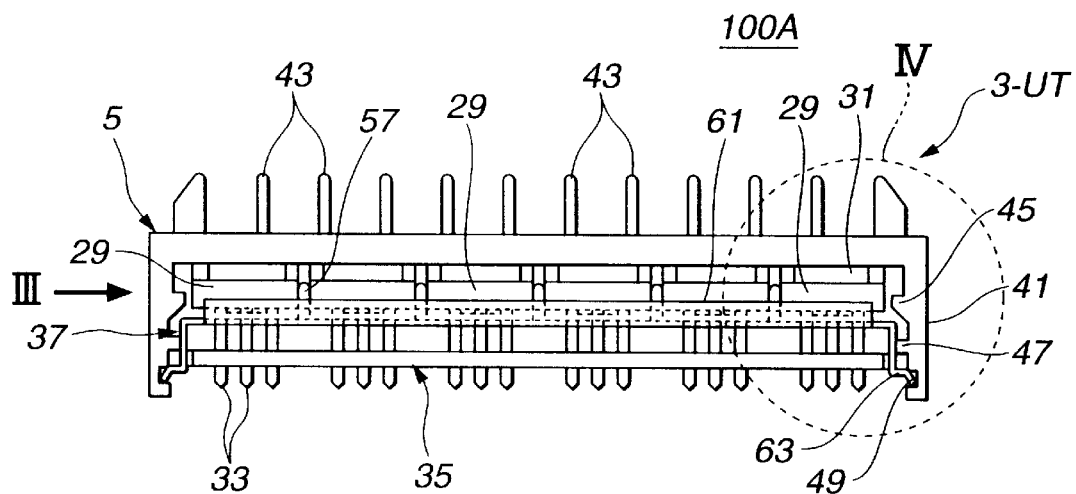
FIG. 1 is a front view of a power element mounting structure which is a first embodiment of the present invention.
Figure 2:
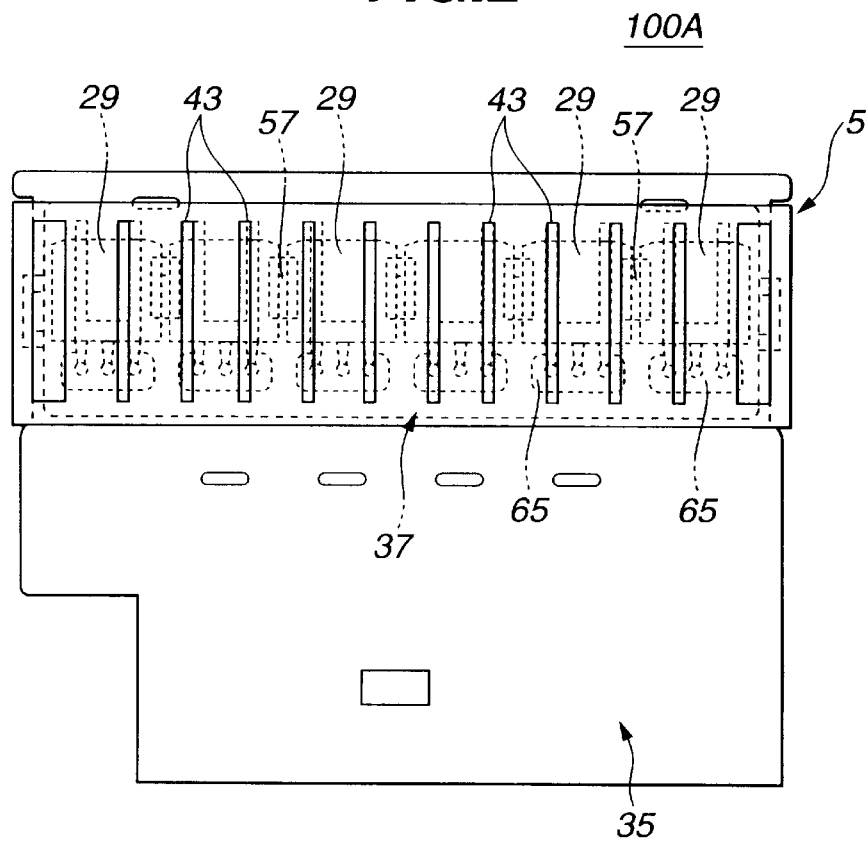
FIG. 2 is a plan view of the power element mounting structure of the first embodiment.
Figure 3:
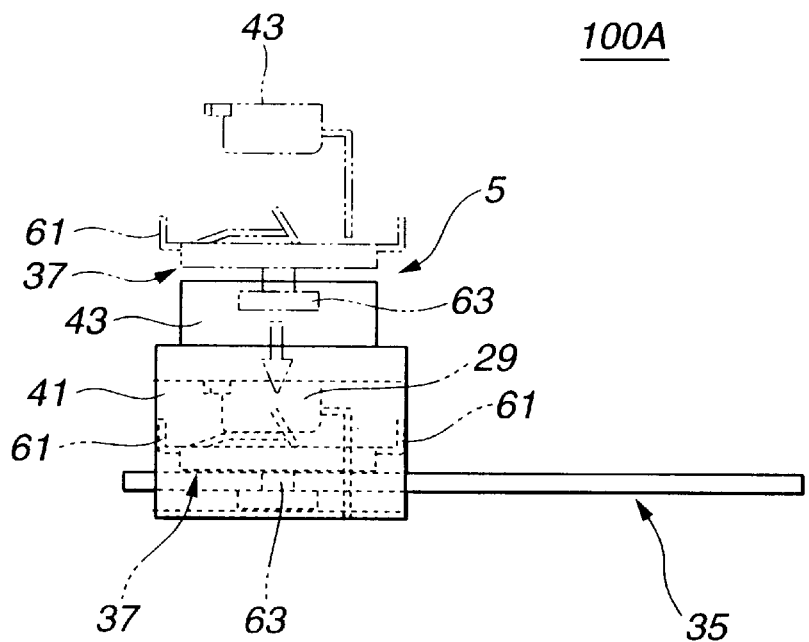
FIG. 3 is a side view taken from the direction of the arrow "III" of FIG. 1.

In the following, embodiments of the present invention will be described in detail with reference to the accompanying drawings. For ease of understanding, various directional terms, such as, upward, downward, rightward, leftward, right, left, upper, lower and the like will be used in the following description. However, these terms are to be understood with respect to only the drawing or drawings on which corresponding members or portions are illustrated.

Referring to FIGS. 1 to 14, there is shown a power element mounting structure 100A which is a first embodiment of the present invention.

First, a brushless motor 1 which has the power element mounting structure 100A installed therein will be described with reference to FIG. 14.

Figure 14:
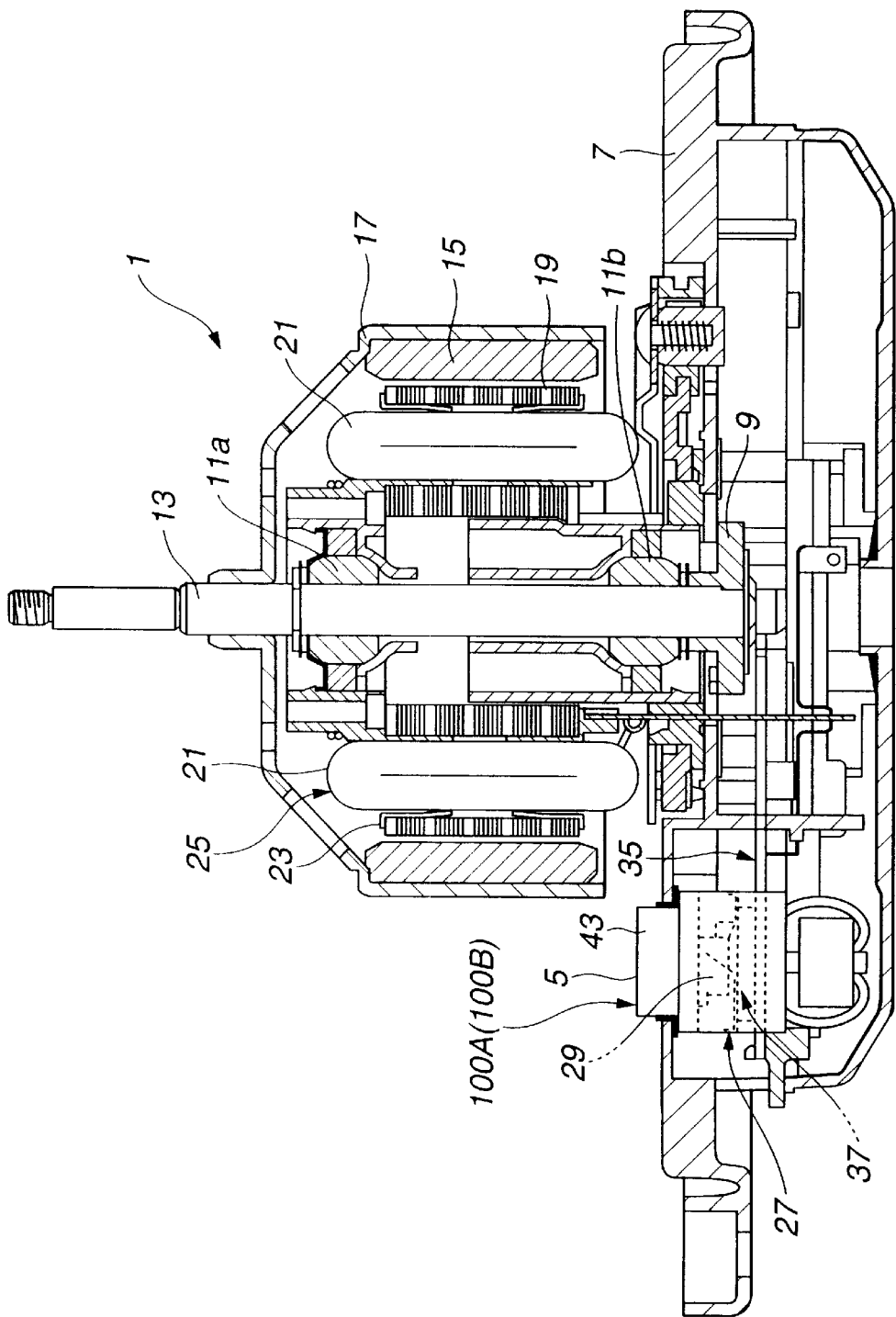
FIG. 14 is a sectional view of a brushless motor which has the power element mounting structure of the first embodiment practically installed therein.

In FIG. 14, there is shown in a sectional manner the brushless motor 1. As will become apparent as the description proceeds, the power element mounting structure 100A is constructed to mount a plurality of power elements 29 to a heat dissipation member 5.

The brushless motor 1 is mounted on a control case 7 and comprises a motor shaft 13. The motor shaft 13 rotatably held by upper and lower bearings 11a and 11b that are installed in a fixed housing 9 that is raised from the control case 7. A cup-shaped yoke 17 concentrically fixed to the motor shaft 13 to rotate therewith. A plurality of magnets 15 are disposed on a cylindrical inner surface of the yoke 17 at equally spaced intervals. A stator 25 is fixedly installed within the yoke 17, which comprises a plurality of cores 23 arranged to surround the fixed housing 9. Each core 23 has a wound coil 21 fixed thereto and has an insulating member 19 facing the inner surface of the yoke 17.

Within the control case 7, there is arranged a drive circuit section 27 which feeds the stator 25 with a controlled electric power to rotate a unit including the motor shaft 13 and the yoke 17. The drive circuit section 27 comprises condensers, power connectors and the plurality of power elements 29. Each of these power elements 29 controls switching of current flowing therethrough.

In the following, the power element mounting structure 100A of the first embodiment will be described in detail with reference to the drawings.

Figure 13:
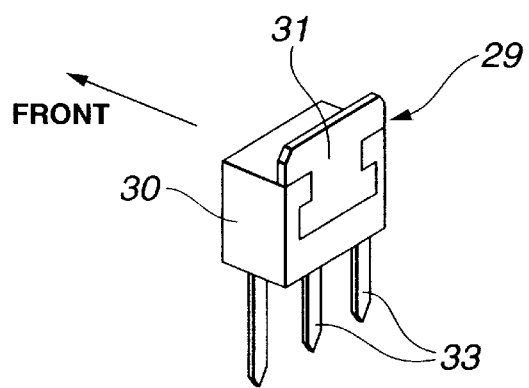
FIG. 13 is a perspective view of the power element.

As is seen from FIG. 13, for effective heat dissipation, each power element 29 is of an exposed type that has a lead frame 31 which is exposed from a plastic housing 30. MOS type field effect transistors are installed in the housing 30. Of course, if desired, the power element 29 may be of a non-exposed type in which the lead frame 31 is covered with a plastic or the like. Three terminals 33 extend outward from the casing 30.

Referring back to FIG. 14, the terminals 33 of each power element 29 are soldered to given portions of a circuit board 35 which is fixedly installed in the control case 7. As is seen from FIGS. 1, 4 and 13, the exposed lead frame 31 of each power element 29 is raised up from a back side of the casing 30, and as is best understood from FIG. 4, the lead frame 31 abuts against a back surface 5a of the heat dissipation member 5. For this abutting, a spring plate 37 (see FIGS. 7 and 8) is used for pressing the lead frame 31 against the back surface 5a. The spring plate 37 is made of a metal.

Figure 5:
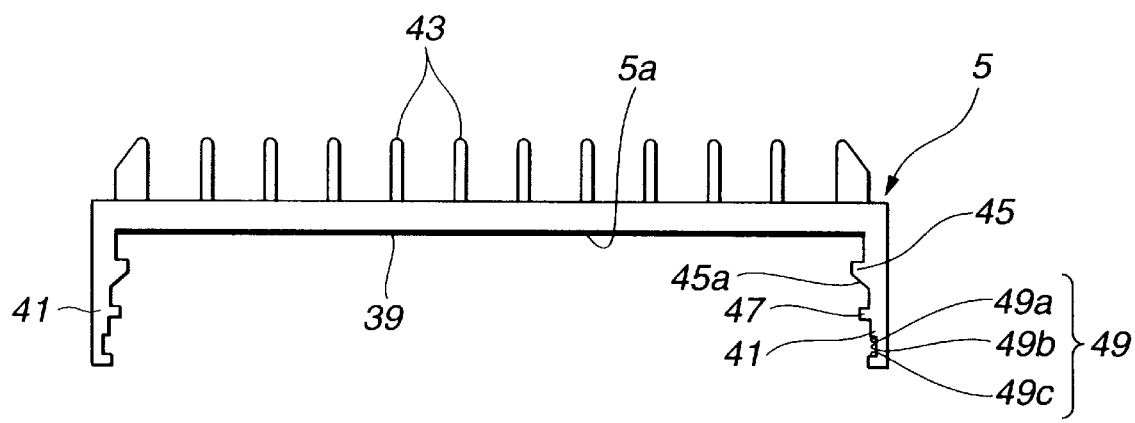
FIG. 5 is a front view of a heat dissipation member that constitutes a part of the power element mounting structure of the first embodiment.
Figure 6:
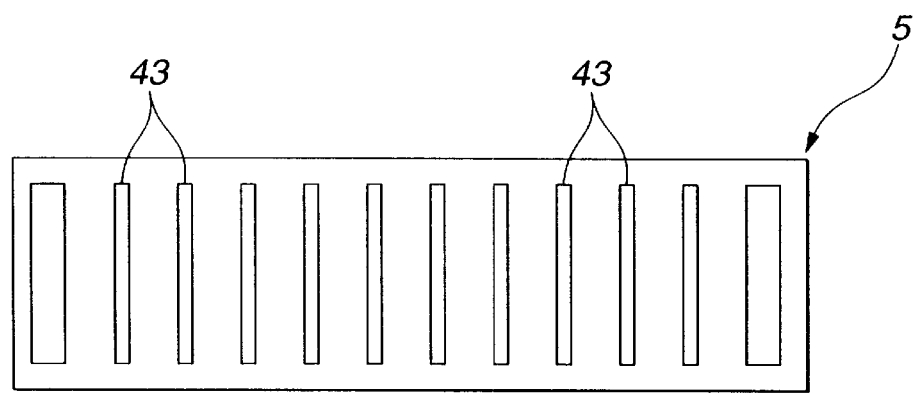
FIG. 6 is a plan view of the heat dissipation member.

As is seen from FIG. 5, the back surface 5a of the heat dissipation member 5 is lined with an electrically insulating heat dissipation sheet 39. Thus, the abutting of the lead frame 31 against the back surface 5a is made with interposal of the sheet 39 therebetween. The heat dissipation member 5 is made of a metal material having a high thermal conductivity. The heat dissipation member 5 is formed at both ends thereof with mounting lugs 41 which extend in the same direction. The heat dissipation member 5 is formed on a major portion thereof with a plurality of heat dissipation fins 43 which are spaced from one another.

As is seen from FIG. 5, each of the mounting lugs 41 of the heat dissipation member 5 is formed at an inner surface thereof with a first projection 45, a second projection 47 and a spring supporting portion 49.

The first projection 45 has a slanted surface 45a that faces downward. As is understood from FIG. 1, upon assembly, aligned power elements 29 are arranged between the first projections 45 of the mounting lugs 41. Furthermore, as is seen from FIG. 4, upon assembly, there is defined a clearance "d" between the lead frame 31 of the rightmost (or leftward) power element 29 and the inner surface of the right (or left) mounting lug 41 of the heat dissipation member 5.

Figure 4:
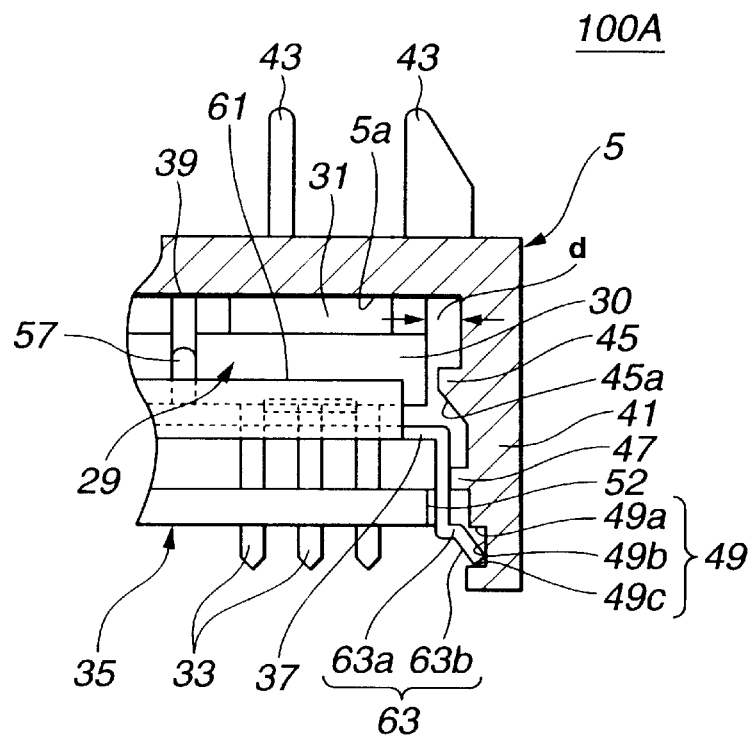
FIG. 4 is an enlarged view of the part indicated by reference "IV" of FIG. 1.

As is seen from FIG. 4, upon assembly, the second projection 47 of each mounting lug 41 is in abutment with an end of the circuit board 35.

Figure 9:
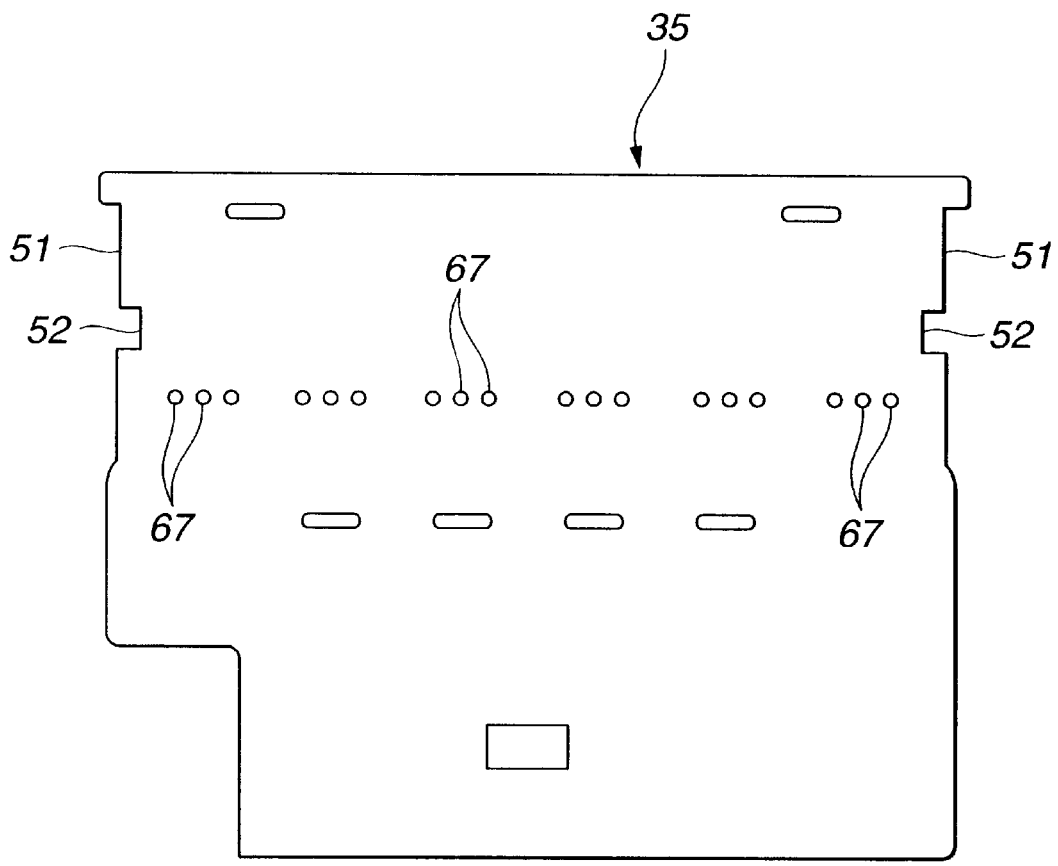
FIG. 9 is a plan view of a circuit board that constitutes a part of the power element mounting structure of the first embodiment.

As is seen from FIGS. 4 and 9, each end of the circuit board 35 is formed with a shallow recess 51 along which the corresponding mounting lug 41 slides down when the heat dissipation member 5 is pushed down for its assemblage.

As is seen from FIG. 9, each shallow recess 51 is formed with an engaging notch 52 whose width is substantially the same as that of an after-mentioned supporting lug 63 of the spring plate 37. The circuit board 35 is formed with six sets of small openings 67 which are aligned. Each set includes three aligned openings 67. As will become apparent hereinafter, each set of openings 67 has the three terminals 33 of the power element 29 passed therethrough.

As is seen from FIGS. 4 and 5, the spring supporting portion 49 of each mounting lug 41 comprises a rectangular recess which includes upper and lower horizontal surfaces 49a and 49c and a vertical surface 49b.

As is seen from FIG. 4, upon assembly, a leading end of the supporting lug 63 formed on each end of the spring plate 37 is put into the corresponding recess (49a, 49b, 49c) in a snap action manner, and at the same time, a major portion of the supporting lug 63 is received in the engaging notch 52 of the circuit board 35.

Figure 7:
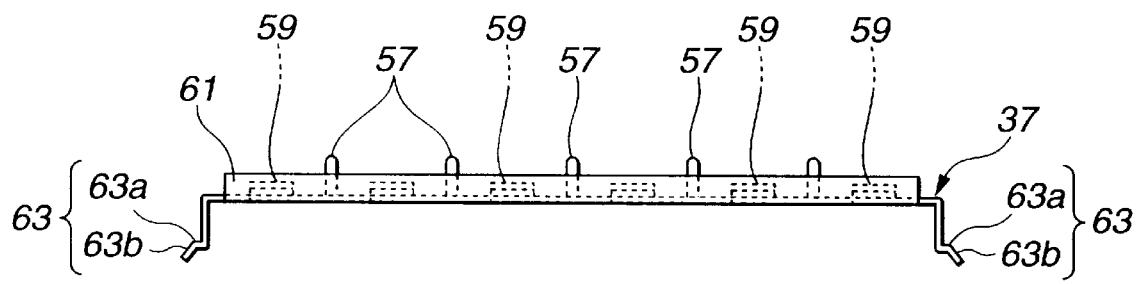
FIG. 7 is a front view of a spring member that constitutes a part of the power element mounting structure of the first embodiment.
Figure 8:
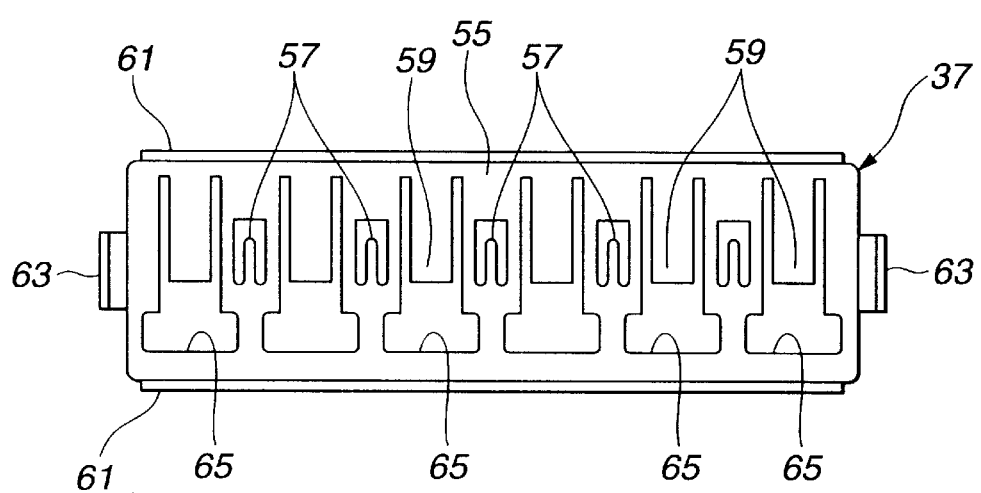
FIG. 8 is a plan view of the spring member.

As is seen from FIGS. 7 and 8, the spring plate 37 is rectangular in shape and has a width substantially equal to that of the above-mentioned heat dissipation member 5. The spring plate 37 is formed at both sides of a major portion 55 thereof with front and rear hedge portions 61. As is understood from FIG. 7, the spring plate 37 is formed at longitudinal ends thereof with respective supporting lugs 63 which extend in the same direction. Each supporting lug 63 comprises a horizontal portion 63a and a slanted portion 63b. As is seen from FIG. 4, upon assembly of the spring plate 37, the slanted portion 63b thereof is deeply engaged with the recess (49a, 49b, 49c) of the mounting lug 41 of the heat dissipation member 5.

Referring back to FIGS. 7 and 8, particularly FIG. 8, the spring plate 37 is formed with six identical openings 65 which are aligned along the axis of the plate 37. Each opening 65 is formed with a rectangular spring piece 59. Furthermore, the spring plate 37 is formed with five identical smaller projections 57, each being arranged between adjacent two of the openings 65. As is seen from the drawings, the spring pieces 59 and the smaller projections 57 are provided by pressing out of the main portion 55 of the spring plate 37 and raising them upward. As is understood from FIG. 11, upon assembly, each power element 29 is put between adjacent two of the projections 57, and each spring piece 59 presses and biases the power element 29 upward, and at the same time, the front and rear hedge portions 61 of the spring plate 37 press front and rear surfaces of each power element 29. Due to provision of the front and rear hedge portions 61, stiffness of the spring plate 37 is increased. As is seen from FIGS. 8 and 11, the three terminals 33 of each power element 33 pass through the corresponding opening 65 of the spring plate 37.

In the following, the process of assembling the mounting structure 100A will be described with reference to the drawings.

Figure 10:
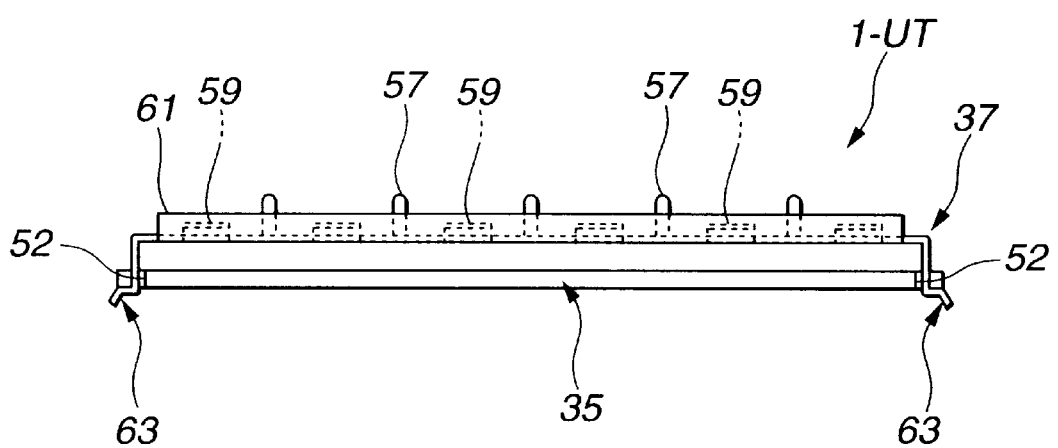
FIG. 10 is a front view of a semi-assembled unit that includes the circuit board having the spring member mounted thereon.

As is shown in FIG. 10, the spring plate 37 is mounted onto the circuit board 35 from the above to provide a first semi-assembled unit "1-UT". In this unit "1-UT", the supporting lugs 63 of the spring plate 37 are respectively received in the engaging notches 52 (see FIG. 9) formed at laterally opposed ends of the circuit board 35. Due to the resiliency possessed by the supporting lugs 63, the first semi-assembled unit "1-UT" shows a certain self-holding characteristic.

Figure 11:
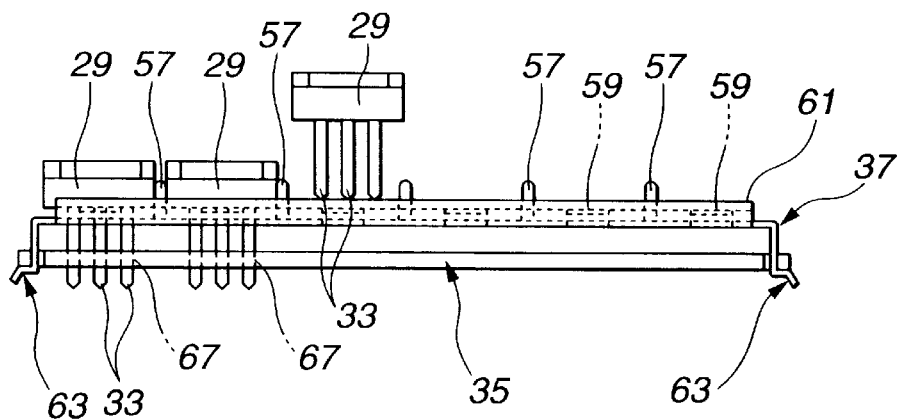
FIG. 11 is a front view of the semi-assembled unit with some power elements being mounted thereon.
Figure 12:
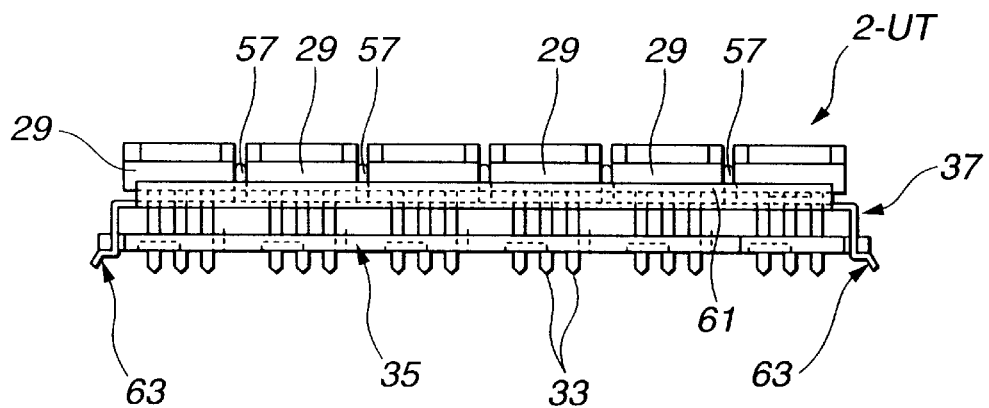
FIG. 12 is a view similar to FIG. 11, but showing a condition wherein all power elements are mounted on the semi-assembled unit.

Then, as is seen from FIGS. 11 and 12, six power elements 29 are mounted on the major portion 55 of the spring plate 37 one by one in the above-mentioned manner. In this condition, each power element 29 is sandwiched between adjacent two of the smaller projections 57 and between the front and rear hedge portions 61 of the spring plate 37, having the three terminals 33 passed through the corresponding opening 65 of the spring plate 37 and through the three small openings 67 of the circuit board 35. With this, the power elements 29 are properly positioned on the spring plate 37 while being kept apart from one another by the aligned smaller projections 57 of the spring plate 37. That is, as is seen from FIG. 12, a second semi-assembled unit "2-UT" is provided.

Then, as is seen from FIGS. 1 and 4, the heat dissipation member 5 is mounted on the second semi-assembled unit "2-UT" in a manner to cover the six power elements 26. As may be seen from FIG. 4, during this mounting, the slanted surface 45a of the first projection 45 on each mounting lug 41 of the heat dissipation member 5 may slidably contact the outer surface of the rightmost (or leftmost) power element 29. However, this contacting allows the power element 29 to take the right position. Upon proper mounting on the second semi-assembled unit "2-UT", the heat dissipation member 5 is supported on the circuit board 35 by the second projections 47 of the mounting lugs 41. At the same time, the supporting lugs 63 of the spring plate 37 are engaged with the spring supporting portions 49 of the mounting lugs 41 of the heat dissipation member 5. Upon this, due to function of the spring pieces 59 of the spring plate 37, the lead frames 31 of the power elements 29 are biased to abut against the back surface 5a of the heat dissipation member 5. With this, a third semi-assembled unit "3-UT" is provided.

Then, the third semi-assembled unit "3-UT" is led to a soldering line to put the back surface of the circuit board 35 into a soldering pot. With this, the terminals 33 of the six power elements 29 are soldered to given portions of the circuit board 35 at the same time and thus the power element mounting structure 100A is finally produced.

In the mounting structure 100A, there is provided a shorter heat transferring passage for each power element 29, that extends from the back surface 5a of the heat dissipation member 5 to the heat dissipation fins 43 of the same. That is, the heat generated by each of the power element 29 can be instantly and effectively transferred to the heat dissipation fins 43. As is understood from the above, the mounting structure 100A is easily assembled, which allows reduction in production cost. The aligned six power elements 29 are substantially wholly enclosed by the heat dissipation member 5 of metal, the spring plate 37 of metal and the front and rear hedge portions 61 of the spring plate 37, and thus, noise radiation from the power elements 29 is effectively suppressed. If a minus terminal of an electric connector (not shown) is connected to a body structure of the brushless motor 1 through an earth portion of the circuit board 35, such noise shielding is much effectively achieved.

Figure 17:
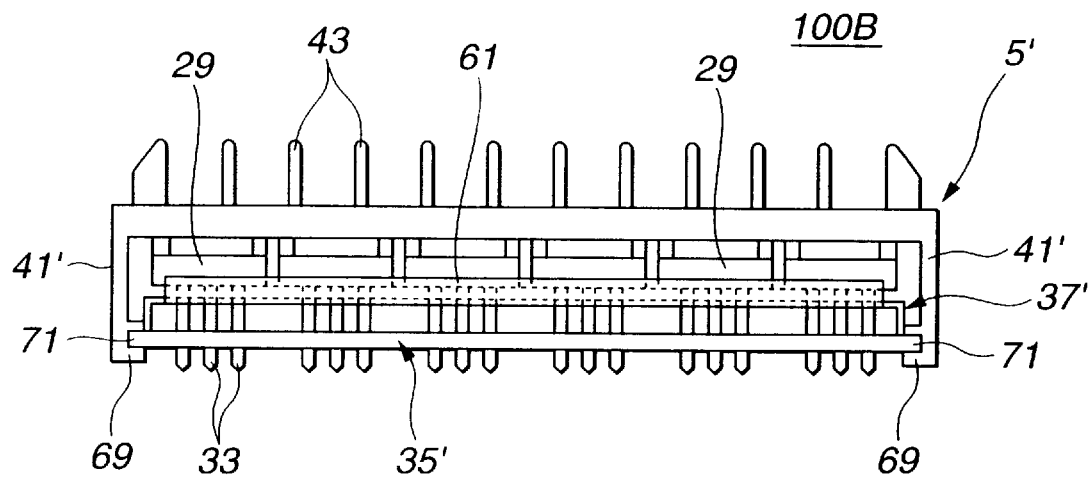
FIG. 17 is a view similar to FIG. 1, but showing a power element mounting structure of the second embodiment of the invention.
Figure 18:
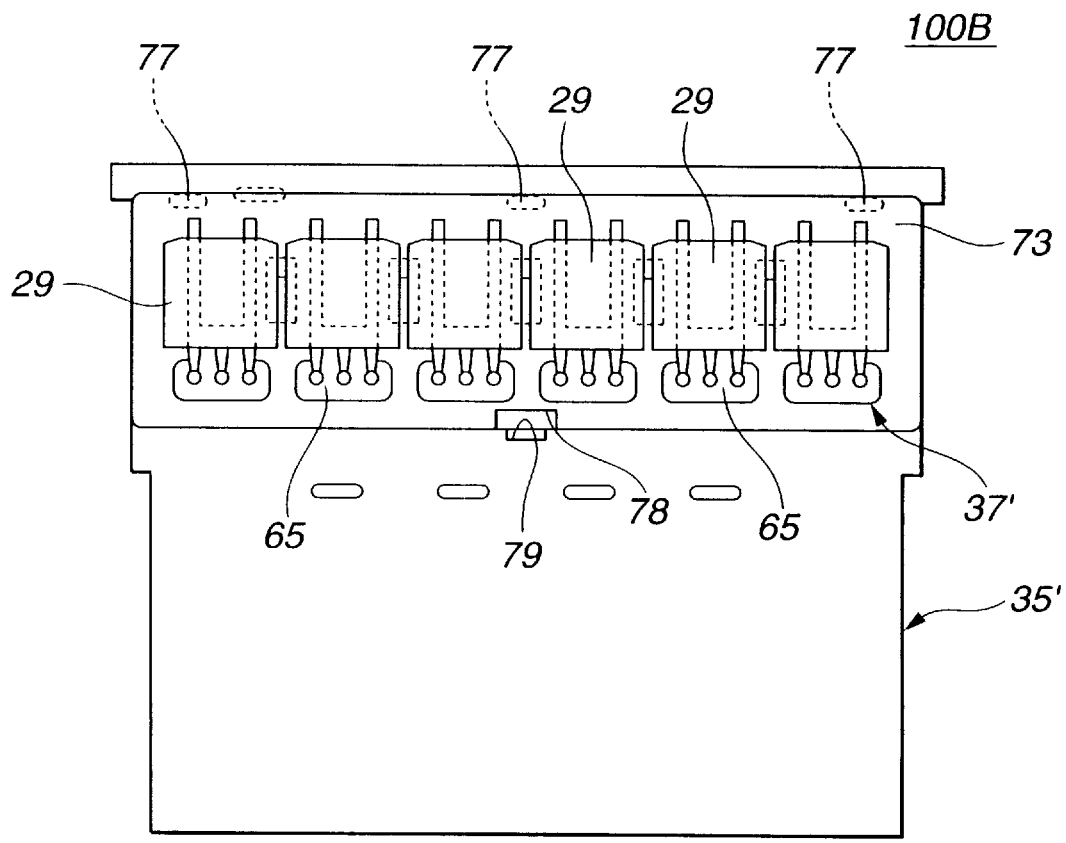
FIG. 18 is a plan view of the power element mounting structure of the second embodiment.

Referring to FIGS. 15 to 19B, particularly FIGS. 17 and 18, there is shown a power element mounting structure 100B which is a second embodiment of the present invention.

Since the second embodiment 100B is similar in construction to the above-mentioned first embodiment 100A, only parts and/or portions different from those of the first embodiment 100A will be described in the following.

Figure 15:
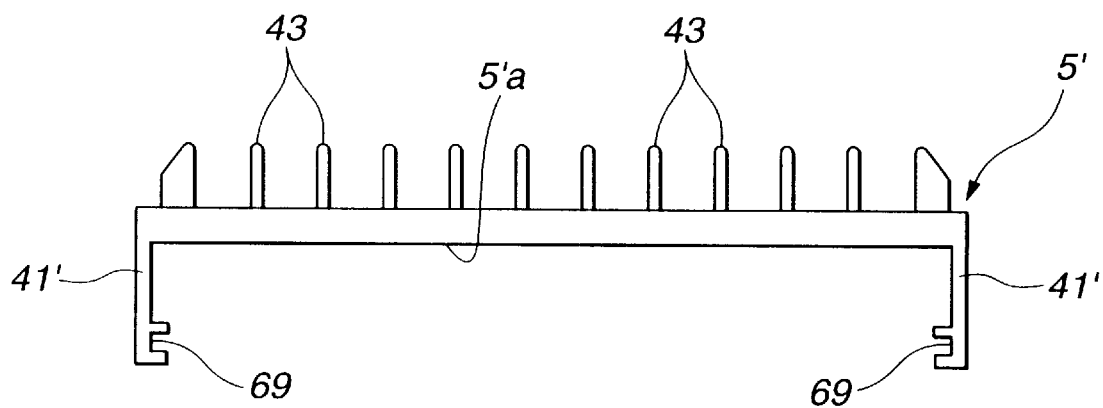
FIG. 15 is a view similar to FIG. 5, but showing a heat dissipation member employed in a second embodiment of the present invention.
Figure 16:
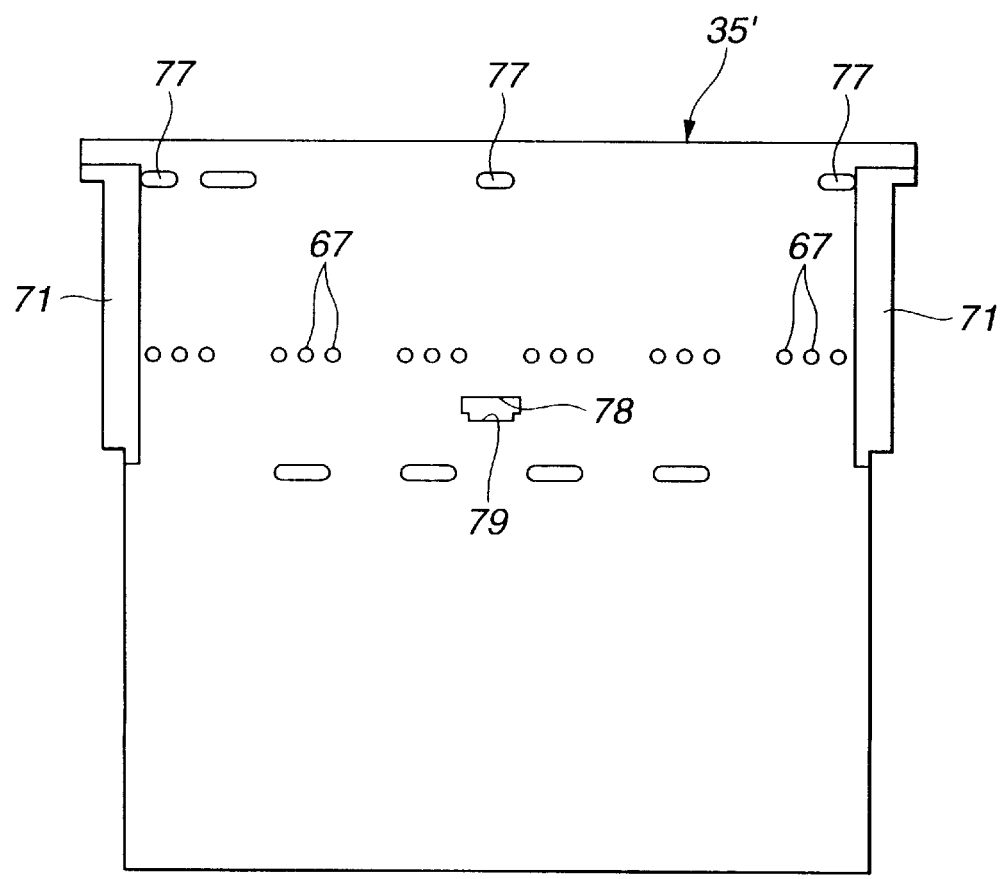
FIG. 16 is a view similar to FIG. 9, but showing a circuit board employed in the second embodiment of the present invention.

As is seen from FIG. 15, the mounting lugs 41' of the heat dissipation member 5' employed in the second embodiment 100B are each provided with a supporting groove 69. As is seen from FIG. 16, the circuit board 35' employed in the second embodiment 100B has at both sides exposed earthed areas 71 which, upon assembly, are to be slid into the supporting grooves 69 of the heat dissipation member 5'. Furthermore, the circuit board 35' is formed at a rear end portion thereof with three spaced engaging openings 77 and at a generally center portion thereof with a holding opening 78. The holding opening 78 has a narrower section 79 which extends forward. The engaging openings 77 and the holding opening 78 are those to which leg portions of the spring plate 37' are engaged.

Figure 19A:
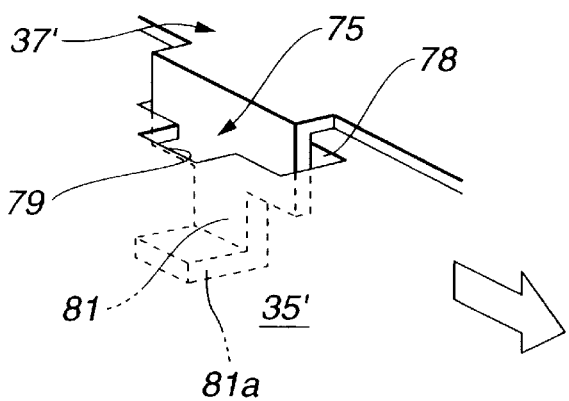
FIGS. 19A and 19B are illustrations showing the process of properly mating a leg portion of the spring member with a holding opening formed in the circuit board, in case of the second embodiment.
Figure 19B:
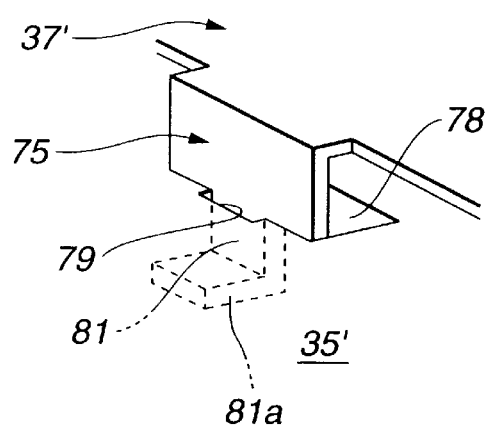

That is, as is seen from FIGS. 19A and 19B, in addition to the above-mentioned parts 57, 59 and 61 possessed by the spring plate 37 of the first embodiment 100A, the spring plate 37' employed in the second embodiment 100B has further at a front center portion a leg portion 75 and at a rear end portion the three spaced leg portions (not shown). The spring plate 37' has no structure corresponding to the supporting lugs 63 possessed by the spring plate 37 of the first embodiment 100A.

The leg portion 75 is so sized as to pass through the holding opening 78 and has a narrower part 81 that extends downward. The narrower part 81 has a bent end 81a. As is seen from these drawings, the narrower part 81 is so sized as to pass through the narrower section 79 of the holding opening 78 of the circuit board 35'. Although not shown in the drawings, the other three leg portions formed at the rear end portion of the spring plate 37' have each a catch portion that, upon assembly, catches the corresponding engaging opening 77 of the circuit board 35'. It is to be noted that these three leg portions and the above-mentioned leg portion 75 are constructed to expand outward when no stress is applied thereto. Thus, when these four leg portions 75 are mated with the corresponding engaging and holding openings 77 and 78 and then, as is seen from FIGS. 19A and 19B, the spring plate 37' is lifted by a certain distance from the circuit board 35', the narrower part 81 of the leg portion 75 of the spring plate 37' becomes in engagement with the narrower section 79 of the holding opening 78 of the circuit board 35' resulting in that the spring plate 37' is latched to the circuit board 35' keeping a certain space therebetween.

In the following, the process of assembling the mounting structure 100B of the second embodiment will be described.

First, the spring plate 37' is temporarily mounted on the circuit board 35' in the above-mentioned manner, and then the six power elements 29 are mounted on the major portion of the spring plate 37' in substantially the same manner as in the case of the first embodiment 100A. Then, the heat dissipation member 5' is mounted on the circuit board 35' in a manner to cover the six power elements 26. For this mounting, the lateral edges, more specifically, the exposed earthed areas 71 of the lateral edges of the circuit board 35' are slid into the supporting grooves 69 of the heat dissipation member 5'. Then, as is seen from FIGS. 19A and 19B, the spring plate 37' is lifted causing the narrower part 81 of the leg portion 75 of the spring plate 37' to latched engaged with the narrower section 79 of the holding opening 78 of the circuit board 35'. With this, each power element 29 is pressed against the back surface 5'a of the heat dissipation member 5'. Then, the semi-assembled unit is led to a soldering line to put the back surface of the circuit board 35' into a soldering pot. With this, the terminals 33 of the six power elements 29 are soldered to given portions of the circuit board 35' and at the same time the exposed earthed areas 71 of the circuit board 35' are soldered to the supporting grooves 69 of the heat dissipation member 5', and thus the power element mounting structure 100B is finally produced.

Like in the above-mentioned first embodiment 100A, also in this second embodiment 100B, there is provided a shorter heat transferring passage for each power element 29, that extends from the back surface 5'a of the heat dissipation member 5' to the heat dissipation fins 43 of the same. In the second embodiment 100B, much robust structure is achieved due to the soldering between the exposed earthed areas 71 of the circuit board 35' and the supporting grooves 6 of the heat dissipation member 5'.

The entire contents of Japanese Patent Application P2000-057287 (filed Mar. 2, 2000) are incorporated herein by reference.

Although the invention has been described above with reference to the embodiments of the invention, the invention is not limited to the embodiments described above. Various modifications and variations of the embodiments described above will occur to those skilled in the art, in light of the above teachings.

What is claimed is:

1. A structure comprising:
    a circuit board;
    a spring plate of metal, said spring plate being resiliently mounted, through a first mounting structure, on said circuit board keeping a given space therebetween;
    a plurality of power elements disposed on said spring plate to form a semi-assembled unit;
    a heat dissipation member of metal having a plurality of heat dissipation fins on an outer surface thereof, said heat dissipation member being mounted, through a second mounting structure, on said semi-assembled unit in such a manner that an inner surface thereof faces toward said power elements; and
    a plurality of spring pieces defined by said spring plate, said spring pieces being arranged to press said power elements against the inner surface of said heat dissipation member.

2. A structure as claimed in claim 1, in which said spring pieces are those pressed out of a main portion of said spring plate and raised toward the inner surface of said heat dissipation member.

3. A structure as claimed in claim 2, in which said main portion of said spring plate is formed with a plurality of spaced projections which extend along a longitudinal axis of said main portion, each power element being put between adjacent two of said projections.

4. A structure as claimed in claim 3, in which each of said power elements has an exposed lead frame which is pressed against the inner surface of said heat dissipation member by means of the corresponding spring piece.

5. A structure as claimed in claim 4, in which said main portion of said spring plate is formed with front and rear hedge portions between which the aligned power elements are sandwiched.

6. A structure as claimed in claim 5, in which each of said power elements has terminals whose leading ends are exposed to outside defined below said circuit board through openings formed in the main portion of said spring plate and openings formed in said circuit board, said leading ends being soldered to given portions of said circuit board.

7. A structure as claimed in claim 1, in which said first mounting structure comprises:
    two supporting lugs integrally provided at axially opposed ends of said spring plate; and
    two engaging notches formed at laterally opposed ends of said circuit board, said engaging notches respectively receiving said supporting lugs when the spring plate is mounted on said circuit board.

8. A structure as claimed in claim 7, in which said second mounting structure comprises:
    two mounting lugs integrally provided at axially opposed ends of said heat dissipation member, the mounting lugs being formed with respective recesses which face each other; and
    bent portions provided at leading ends of said supporting lugs of said spring plate, said bent portions being received in said respective recesses of said mounting lugs of said heat dissipation member when said heat dissipation member is mounted on said semi-assembled unit.

9. A structure as claimed in claim 8, in which each of said mounting lugs of said heat dissipation member is formed at its inner surface with projections which are arranged to support said semi-assembled unit.

10. A structure as claimed in claim 1, in which said first mounting structure comprises:
    a plurality of leg portions integrally provided at periphery of said spring plate; and
    a plurality of engaging openings formed in said circuit board, said engaging openings catching said leg portions when said spring plate is mounted on said circuit board.

11. A structure as claimed in claim 10, in which one of said leg portions and one of the engaging openings are so constructed as to establish a latched connection therebetween when moved away from each other by a given distance.

12. A structure as claimed in claim 11, in which said second mounting structure comprises:
    two mounting lugs integrally provided at axially opposed ends of said heat dissipation member, the mounting lugs being formed with respective supporting grooves which face each other; and
    lateral edges of said circuit board, said lateral edges being received in said supporting grooves of said mounting lugs of said heat dissipation member when said heat dissipation member is mounted on said semi-assembled unit.

13. A structure as claimed in claim 12, in which each of said lateral edges of said circuit board is formed with an exposed earthed area which is soldered to the corresponding supporting groove of said heat dissipation member.

* * * * *